July 17, 1962 R. S. ENGELBRECHT 3,045,189

TRAVELING WAVE PARAMETRIC AMPLIFIER

Filed Jan. 16, 1959

INVENTOR
BY R. S. ENGELBRECHT

A. C. Waite
ATTORNEY

United States Patent Office 3,045,189

Patented July 17, 1962

3,045,189

TRAVELING WAVE PARAMETRIC AMPLIFIER

Rudolf S. Engelbrecht, Basking Ridge, N.J., assignor to Bell Telephone Laboratories, Incorporated, New York, N.Y., a corporation of New York Filed Jan. 16, 1959, Ser. No. 787,305
17 Claims. (Cl. 330—7)

Figure 1:
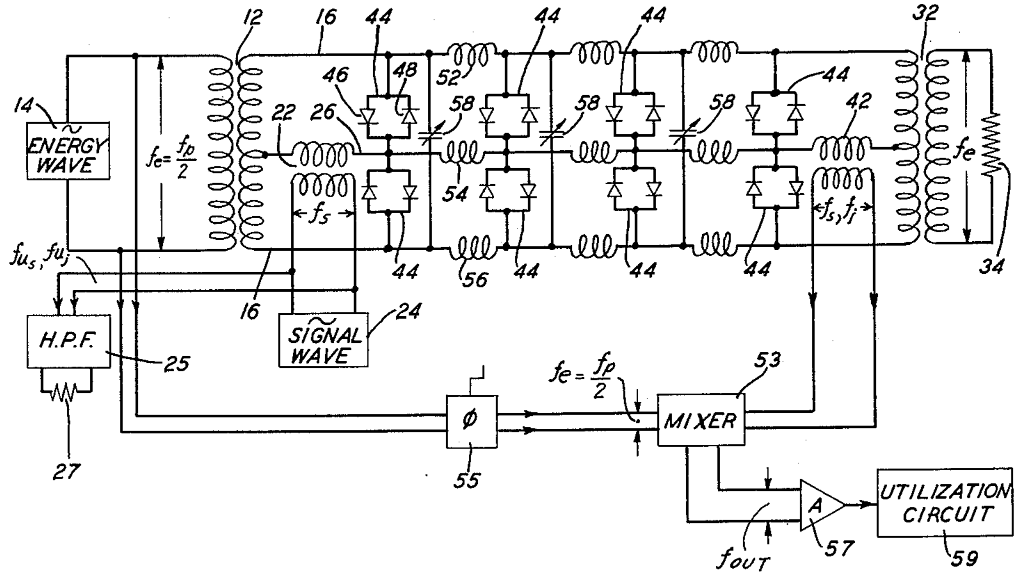

This invention relates to traveling wave signal amplifiers. More particularly, in important aspects, the invention relates to improvements in systems for transferring energy from a power wave in one frequency range to a signal wave in another frequency range as the two waves are propagated along non-linearly intercoupled paths.

Heretofore it has been known that wave energy from one source, for example, a locally available power source, may be transferred to and thus amplify another wave, for example, a communication signal wave. This has been done by propagating the two waves along associated paths and by providing a properly phased non-linear intercoupling between the two. Advantageously, such intercoupling has been accomplished by wave controlled, non-linearly variable reactance devices in the wave propagation paths. Thus, the energy supplying wave controls the reactive intercoupling between itself and a communication signal wave to be amplified.

In such a system, it is convenient for analysis to view this variable intercoupling under control of the energy wave as being a propagation of an associated pump wave of variable intercoupling reactance. While in many such systems this wave of intercoupling, or pump wave, is identical in most respects to the energy wave, for example, in frequency, such need not be the case. Indeed, in accordance with one embodiment of the present invention, advantage is taken of this fact to provide structures in which the energy wave is of half the frequency of the intercoupling, or pump, wave as considered in detail hereafter.

This type of energy transfer amplifying structure has become known in the art as a traveling wave parametric amplifier to signify the variation in circuit parameters, e.g., reactances, which gives rise to signal amplification. Alternatively, such apparatus has been designated as Mavar apparatus, this coined word being a contraction of modulated amplification through variable reactance.

One illustrative type of such parametric amplifier has been disclosed in a patent application of P. K. Tien, Serial No. 724,103, filed March 26, 1958, now abandoned. Mathematical relationships governing the propagation of waves for the desired energy interchange in this amplifier have been discussed by Suhl and Tien in the cited patent application; by J. M. Manley and H. E. Rowe in the Proceedings of the Institute of Radio Engineers for July 1956, volume 44, No. 7, page 904; and by P. K. Tien in the Journal of Applied Physics for September 1958, volume 29, No. 9, page 1347.

This type of amplifier presently offers great promise as a broadband amplifier for radio signals in the high frequency range where random atmospheric noise tends to drop below the thermal noise level of more conventional amplifiers. In this frequency range, the parametric amplifier possesses great potentialities of being a highly effective low noise amplifier.

Militating against realization of these potentialities in the past, however, have been several interrelated structural complexities. The complexities arise fundamentally from the mathematical precision required in the phase relationships among the various waves in order to accomplish desired energy interchange and signal amplification. It is a general object of my invention to circumvent these structural complexities, and thereby to provide a more efficient and more economical parametric amplifier.

One of these structural complexities encountered in prior art structures resulted from the fact that the transfer of energy from the one wave to the other was accompanied by a variation in the relative velocities of the two waves. This variation arose from several causes. An important one among these causes on which to focus attention is the small amplitude of the signal wave in a useful amplifier of this type. The energy supplying wave employed for controlling the intercoupling between the two waves conversely is by nature of large amplitude. Hence variations in the wave propagating parameters introduced by the energy supplying wave did not introduce to the wave propagation paths the same velocity variations for both small and large signals.

Further, as the desired energy interchange progressed, the energy supplying wave decreased in amplitude while the signal wave increased far out of proportion. Accordingly, parametric amplifiers of the prior art have encountered extreme difficulty in maintaining proper amplifying phase relationships between a small amplitude signal wave and a large amplitude energy wave with its associated wave of intercoupling over any but an extremely short length of energy interchanging propagation path. Accordingly, it is a more specific object of my invention to extend the path length over which proper intercoupling phase relationships may be maintained, and thus to increase the amplification of a parametric amplifier.

Further, since iterative transmission paths, that is, non-uniform, lumped constant transmission paths such as those necessitated by the signal controlled intercoupling elements of the traveling wave parametric amplifier, are velocity dispersive, the adjustments necessary to establish proper phase relationships between the small amplitude signal wave and the large amplitude energy wave at one frequency have not been equally effective in prior art structures for establishing these phase relationships at another frequency so that the amplification bandwidth of prior art parametric amplifiers has been severely limited. It is thus a further object of my invention to increase the bandwidth over which parametric amplifiers are effective.

In accordance with a principal feature of my invention, these objects are achieved by providing wave propagation paths in which the signal and energy waves are propagated in electrically balanced relation. One wave is propagated along a path so as to have an odd symmetry with respect to a given reference point and the other wave is propagated so as to have an even symmetry with respect to that same point. For electrical waves and in the context of the invention, even symmetry implies that for every charge on one side of a reference point there is a corresponding charge of like polarity on the other side of the reference point. Odd symmetry in this same context implies that each charge on one side of a reference point finds a corresponding charge of opposite polarity on the other side of the reference point.

By providing balanced propagation paths for the two waves, the propagation velocity of either may be, and, by means of the structures in accordance with one feature of the invention is, adjustable along the path as phase relations tend to be disturbed. Importantly, this adjustment of the propagation of one wave is accomplished independently of the propagation velocity of the other. Thus, in accordance with this feature of my invention, the length of propagation path over which appropriate amplifying phase relationships may be maintained between a signal wave and a pump wave is extended indefinitely. In this manner, the parametric amplifier becomes capable of providing signal amplification which is limited only by the power of a locally available source through the simple expedient of extending the propagation paths for the two waves.

Structures employing the balanced propagation paths of my invention also achieve a further object of the invention in accomplishing parametric amplification over a markedly increased frequency bandwidth. This follows from the fact that the propagation velocities of the two waves are rendered independently adjustable by the balanced propagation structures in accordance with the invention. Each of the balanced propagation paths provided is constructed in accordance with well-known techniques for providing appropriate wave propagation bandwidth in accordance with a further feature of the invention. Such wave propagating structures for waves of great bandwidth are well known in the art, particularly in the high frequency range where the parametric amplifier finds most advantageous employement. The balanced arrangements of the propagation paths provided thus free each of these paths from a delicate interdependence upon one another for phase propagation adjustments. Thus, near unbounded propagation bandwidth becomes available for parametric amplifying purposes.

As noted heretofore, the traveling wave parametric amplifier is particularly useful in high frequency ranges. Further, it is known that parametric amplifiers are particularly advantageous if they operate within the conditions that energy is transferred from the energy wave to the signal wave and to a lower sideband wave product of intermodulation action between the signal wave and the intercoupling pump wave. In the art, this lower sideband wave is known as the idler wave, and a well-known mathematical expression for the above-indicated relation is given below:

$$\omega_s + \omega_i = \omega_p \qquad \text{(A)}$$

In this expression, $\omega$ has its customary significance of angular velocity and the subscripts $s$, $i$, and $p$ refer to the signal, idler, and the intercoupling pump waves, respectively.

Thus, the problem of providing wave energy at a high enough frequency to satisfy Expression A becomes one involving substantial expense. Accordingly, it is a still further object of my invention to reduce the frequency required of the parametric amplifying energy source without losing the substantial amplifying advantages gained in the satisfaction of Expression A.

In accordance with a feature of my invention as illustrated in one embodiment thereof, this further object is achieved by providing an energy wave source at a submultiple frequency, for example, at half the frequency of the pump wave. Intercoupling of energy from this source to the signal wave is then accomplished in the balanced propogation paths of such a half-frequency embodiment of my invention through pairs of parallel connected, non-linear intercoupling reactance devices. These devices are reversely oriented within pairs insofar as their reactance variation characteristics is concerned. Illustratively, a pair of reversely poled intercoupling diodes may be employed for such intercoupling. Hence, as a half-frequency, energy supplying wave is propagated along a path to vary the intercoupling reactance of these paired devices, the reverse orientation of the paired devices yields a frequency doubling effect insofar as the resulting intercoupling or pump wave is concerned.

Employment of such a half-frequency energy wave in the past has been impractical in that filters have been necessary in the parametric amplifier output circuits to separate the energy wave from the amplified signal and idler waves. By the relations of expression A such a half-frequency wave lies midway between signal and idler waves. Accordingly, filters to separate a half-frequency energy wave have been prohibitively expensive either from a structural standpoint or from the standpoint of attenuating the signals of the useful signal and idler waves. By employment of the balanced propagating structures in accordance with the invention, all need for filters is discounted since the energy wave and the information bearing signal and idler waves appear automatically in separate output branches of the balanced wave propagating structures.

As noted heretofore, the informational content of a parametrically amplified signal is contained in both a signal and idler wave, each of which advantageously lies in a high frequency range. To bring this information to a convenient frequency range for utilization requires a heterodyne or detector oscillator of a comparable high frequency. To extract the information from both signal and idler waves at the same utilization frequency requires an extreme degree of frequency coherence between such a detector oscillator on the one hand and the signal and idler frequencies on the other. Accordingly, it is a further object of my invention to circumvent this apparent need for additional delicately adjusted and expensive high frequency equipment and yet to substantially double the useful output amplified power of a parametric amplifier by extracting the information from both signal and idler waves.

This dual object is achieved in accordance with a still further feature of my invention. This feature lies in the employment of the half-frequency energy wave source, made possible by the balanced paths of the invention, to supply detector oscillator signals for the parametric amplifier output waves.

Thus, in accordance with this important feature of my invention, a portion of this half pump wave frequency energy wave is applied through a conventional adjustable phase shifter to a conventional frequency mixing network. Both the amplified signal and idler waves from the parametric amplifier are also applied to this network.

It is well known in the signal mixing art that for maximum energy transfer to a single frequency from a pair of frequency spaced waves such as the idler and signal waves, a mixing signal must be applied to these waves in a precise phase relationship. Thus, for a pair of amplitude modulated waves, the mixing signal must be applied in a phase such that maximum amplitudes of these waves and the mixing signal coincide. For phase modulated signals the coincidence of maximum amplitude for the pair of waves must be in phase quadrature with the maximum amplitude of the mixing signal. Hence, in accordance with a feature of my invention, the adjustable phase shift network is provided for establishing the phase relationship needed for the type of signals to be amplified.

Accordingly, in the mixer network the information energy of both the signal and idler waves is extracted and combined at a single frequency for further application to utilization circuits. Thus, the information energy normally available for such circuits is quadrupled and without the structural expense of even a crude detector oscillator, much less a costly, rigidly controlled high frequency oscillator.

As parametric amplification is increased, at least in a sense, almost without bound by the balanced propagating structure in accordance with my invention, an accompanying difficulty is presented. As is well known in the signal amplifying art, great amplification tends to promote instability. Accordingly, the extended balanced amplifying structures in accordance with my invention possess an inherent tendency toward instability and signal destroying oscillation. Though other analyses may apply, this instability in a traveling wave amplifier may be considered to have its origin in waves reflected from inexactly matched terminating impedances at either end of an amplifying path. If, upon reflection, the wave is not attenuated in its travel in the reverse direction so as to overcome its amplification in a forward direction, instability results.

Thus, it is a further object of my invention to take full advantage of the near limitless amplification made possible by practice of my invention without causing signal destructive regenerative instability.

In accordance with one embodiment of my invention, this non-reciprocal amplifying ability is achieved by structures which take advantage of the combination of two important recognitions. The first of these is that a wave of a given frequency propagated in one direction in a given path is completely indistinguishable in external phase effects from another wave propagated in a reverse direction at the same frequency, but at a different velocity, if these effects be observed at discrete points along the path of propagation. That is, an apparent ambiguity exists in the propagation of a wave along such a path. The second of these recognitions lies in the wave amplifying analyses of the Tien article as set forth in the Journal of Applied Physics cited above. In this article, Tien sets forth certain of the mathematical relations which govern bilateral transfer of energy between two waves in parametric amplifying propagation paths. Thus, it is an important feature of my invention to provide discrete intercoupling means between wave propagation paths. More particularly, in accordance with this feature of my invention, the characteristics of the paths are adjusted to take advantage of the above-noted propagation ambiguity. Thus, assuming one direction of propagation for one wave, the path characteristics are adjusted for transfer of energy in a desirable amplifying direction for a wave of one frequency. Assuming a different undesirable propagation direction, these path characteristics are simultaneously adjusted for energy transfer to an entirely different frequency for subsequent disposition.

In accordance with a further feature of my invention, this last-noted energy transfer and disposition is made substantially complete by properly spacing the intercoupling elements along the propagation paths.

An understanding of the structures by which the invention combines these recognitions and turns them to account may be facilitated by a restatement of the fundamental principles governing the traveling wave parametric amplifying process. For purposes of this restatement, it is further convenient to establish distinctive symbols adapted from the prior art to the particular problem of eliminating the instabilities of reverse amplification from the parametric amplifier structure.

Thus, it has been shown that parametric energy transfers may be accomplished by propagating along proper paths a signal wave and an intercoupling controlling and energy supplying pump wave where either of the following relations hold:

$$\omega_s+\omega_i=\omega_p \quad \text{(A)}$$

$$\omega_{u_s}-\omega_s=\omega_p \quad \text{(B)}$$

where $\omega$ has its common significance of angular velocity, the subscripts $p$ and $s$ refer to the pump wave and signal wave, respectively, and the subscripts $i$ and $u_s$ relate to the lower and upper sideband wave products resulting from mixing of the signal and pump waves. A further condition of traveling wave parametric amplification respectively associated with Expressions A and B above are the relations $$\beta_p=\beta_i+\beta_s \quad \text{(C)}$$

$$\beta_p=\beta_{u_s}-\beta_s \quad \text{(D)}$$

Here $\beta$ is the phase propagation constant or phase delay per unit length of a particular path for a signal of a particular frequency as indicated by the subscripts $i$, $p$, $s$, and $u_s$ which have the same significance as the subscripts in Expressions A and B.

Corollary to Expressions B and D, the Expressions B1 and D1 below have been shown to be equally valid relations for accomplishing traveling wave parametric amplification:

$$\omega_p=\omega_{u_i}-\omega_i \quad \text{(B1)}$$

$$\beta_p=\beta_{u_i}-\beta_i \quad \text{(D1)}$$

where the symbols have the significance noted above and the subscripts $u_i$ are associated with the upper sideband wave resulting from an intermodulation action between the idler wave and the pump wave.

Tien has shown mathematically that power may be interchanged periodically between signal ($\omega_s$) and upper sideband waves ($\omega_{u_s}$) under the conditions of Expressions A and C and of B and D above.

To this point, signals propagated unidirectionally have been considered. Similar relationships hold if signals are propagated bilaterally. It appears, therefore, that in a reflectively terminated wave propagation path employed for parametric amplifying purposes, the signal, pump, idler and upper sideband waves all may be reflected to form additional intermodulation products one with another. An important one of these products is the upper sideband wave resulting from the intermodulation action between the idler wave ($\omega_i$) and the pump wave ($\omega_p$).

With each of the waves propagated unidirectionally there are associated phase propagation constants $\beta$. Considering the fact that each of these waves may be reversely propagated, it is well to associated a superscript, plus or minus, with the phase propagation constant of a given wave to indicate one or the other of reciprocal directions of propagation. Thus, by way of illustration, $\beta_s{}^+$ is the phase propagation constant for a transmission path for a signal wave propagated from left to right, and $\beta_s{}^-$ is the corresponding constant for a wave propagated from right to left.

The actual fact of reverse propagation may or may not be a reality for any or all of the waves indicated above. In accordance with the recognitions upon which this one important feature of the invention is founded, it is sufficient to consider that a wave observed at discrete points along a propagation path actually does have phase differences between two such points which are consistent with different phase constants associated with an oppositely propagated wave of the same frequency. Thus, by way of example, a given wave propagated along a path from point A to point B experiences a phase delay of $\pi/3$ radians, i.e., an external observer at the two points may consider the wave as going from A to B and at the latter point lagging in phase by $\pi/3$ radians. This same observer may as well consider that point B is ahead of point A by $2\pi-\pi/3$ radians. Whence, if the propagation path is lossless, this same wave, insofar as external effect is concerned, may be considered to travel from A to B or vice versa. In each case this wave experiences a different phase delay in traveling the very same distance between identical points. Thus, for two waves traversing paths intercoupled at discrete points, one wave may be considered to be an external observer for the other.

Expressing this concept mathematically, there may be written for each wave propagated along a like path a pair of propagation constants. Each constant of these pairs corresponds to the direction of propagation which an external observer at two points in the path may choose to assign to the wave. Since this direction of propagation is a relative matter as it affects the interaction of the signal and pump waves applied to a traveling wave parametric amplifier, one of the waves considered above may be thought to be a reference wave and a particular direction assigned to it as positive.

Thus, with regard to the parametric amplifying Equations C and D, it is convenient to consider the signal wave ($\omega_s$), or wave to be amplified, as a reference wave. Adopting this reference, the propagation constants of parametric amplifying paths may be tabulated as follows:

$$\beta_s{}^+=\beta_s{}^- \quad \text{(E)}$$

$$\beta_p{}^+=2\pi-\beta_p{}^- \quad \text{(F)}$$

$$\beta_i{}^+=\beta_i{}^- \quad \text{(G)}$$

$$\beta_{u_s}{}^+=\beta_{u_s}{}^- \quad \text{(H)}$$

$$\beta_{u_i}{}^+=\beta_{u_i}{}^- \quad \text{(I)}$$

It has been known heretofore that satisfaction of Equations A and C leads to a continuing transfer of energy from a pump wave to both a signal and an idler wave. Similarly, it has been known that satisfaction of Equations B and D or B1 and D1 leads to a periodic interchange of energy between a signal wave and its associated upper sideband wave and between an idler wave and its associated upper sideband wave.

Further, it may be shown that this interchange reaches a maximum in the direction of the upper sideband wave, i.e., all power is transferred to the upper sideband wave from the signal wave or idler wave as the case may be, where the two waves are propagated along a path of definite length $l$ given by Expression J below.

$$l=2nk\pi(\omega_1\omega_2)^{-1/2} \quad (J)$$

In this expression $n$ is an odd integer, $\omega$ denotes the the angular velocity of a wave, the subscript 1 refers alternatively to the signal or idler wave, and the subscript 2 refers to the upper sideband wave associated with an appropriate one of the noted former waves. Further, $k$ represents a constant proportioned according to the amplitude of the non-linear reactance variation employed for intercoupling the signal and energy waves at the pump wave frequency. Still further, $k$ is proportioned in accordance with the characteristic impedances of the wave propagation path to the waves denoted by the subscripts 1 and 2. By way of example, in the case of intercoupling by means of non-linearly varying capacitors, $k$ is given by the Expression J$l$ below.

$$k=(Zo_1Zo_2C^2)^{-1/2} \quad (Jl)$$

where $Zo$ is the characteristic impedance of the wave propagation path for the wave indicated by the subscript 1 or 2, and C is the amplitude of the capacitance variation introduced for wave intercoupling by the energy wave. Similar relations may be drawn for inductive intercoupling systems.

Thus, by inspection of Expression J it is clear that for maximum energy transfer from a signal wave or an idler wave to an associated upper sideband wave, the length $l$ of a particular energy interchanging path is proportioned to the geometric mean of the frequencies of the two waves indicated by the numerical subscripts 1 and 2.

As a first step in turning these recognitions to account, my invention provides paths in which propagated waves are non-linearly intercoupled at discrete points. These paths, in one embodiment of the invention, are then further designed in accordance with well-known techniques such that in a desired direction the relations of Expression C hold true, but that at the same time, the relations of Expressions D and D$l$ are not satisfied by a large margin. That is to say $$\beta_p=\beta_i+\beta_s \quad (C)$$

$$\beta_p\neq\beta_{u_s}-\beta_s \quad (K)$$

$$\beta_p\neq\beta_{u_i}-\beta_i \quad (L)$$

Physically, establishment of the conditions of Equation C in the propagation paths of my invention signifies that in one direction of propagation energy is transferred from the pump wave ($\omega_p$) to both the signal wave ($\omega_s$) and the idler wave ($\omega_i$) in each of which the informational content of the applied signal wave is contained. At the same time, the inequalities of Expressions K and L signify that no energy is transferred from the pump wave to either of the upper sideband waves. Consequently, a maximum of power is transferred to the comparatively low frequency signal and idler waves for most economical employment in further utilization circuits.

Such utilization circuits rarely provide an impedance match to permit complete utilization of the power provided by any network such as the amplifier of my invention. Accordingly, some portion of the energy in the amplified signal and idler waves is reflected. This reflected energy might tend to promote regenerative oscillations in being reversely propagated along the paths of the parametric amplifying structure. In accordance with my invention, the wave propagation ambiguity expressed by Equation F is turned to advantage. Noting the Expressions E through I, the discretely intercoupled paths are designed such that in the reverse direction of wave propagation the requirements of Expressions D and D$l$ are satisfied. Thus, the intercoupled propagation paths provided effect a transfer of energy from the energy supplying wave into one desirable frequency range in a preferred direction of wave propagation. At the same time, these paths effect a transfer of reversely propagated signals to a far-removed frequency range for easy disposition in a dissipating impedance.

Toward insuring a maximum transfer of reversely propagated wave energy to this far-removed frequency range, the discrete intercoupling means are spaced apart by a distance closely approximately the distance $l$ given by Expression J for both the signal and idler waves. In this manner, advantage is taken of the fact that the energy transfer between signal and idler waves and the associated upper sideband waves varies substantially sinusoidally. Thus, at points of maximum energy transfer, the variation rate of this transfer is substantially zero. It is to be noted that Expression J is referable alternatively to signal and idler waves with associated upper sidebands for determining a length $l$ between intercoupling elements for effecting a maximum energy transfer. Accordingly, the structures provide at least two intercoupling elements which are spaced along the wave propagation paths in substantial proportion both to the geometric mean of the signal wave frequency and its associated upper sideband frequency, and to the geometric mean of the idler wave frequency and of its associated upper sideband frequency.

Figure 2:
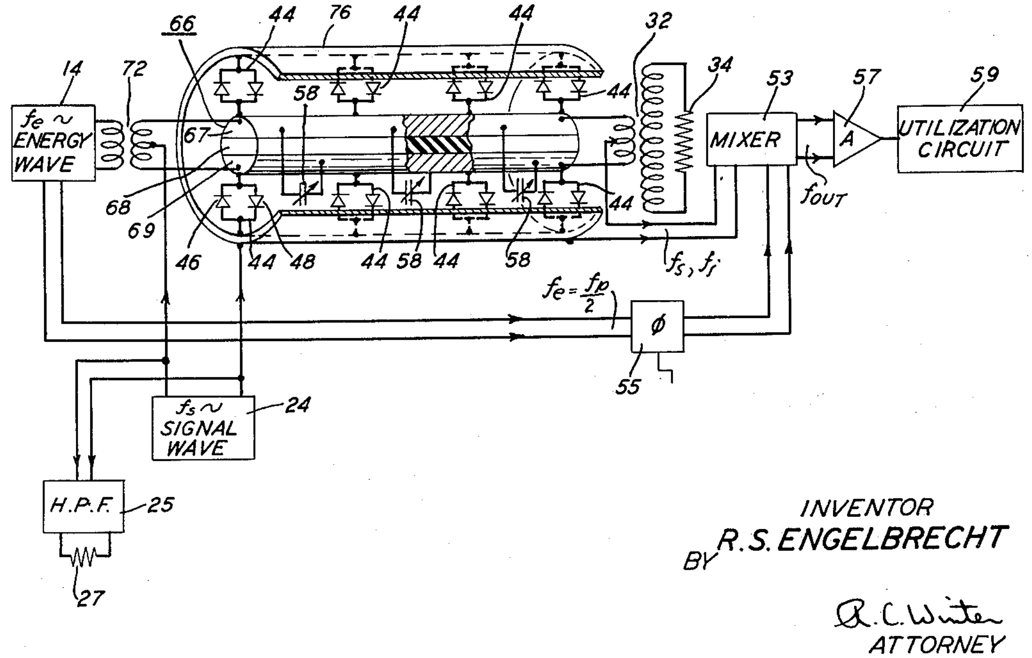

A complete understanding of this invention and of these and other features thereof may be gained from a consideration of the following detailed description of illustrative embodiments thereof taken together with the accompanying drawing, in which:

FIG. 1 is a schematic diagram of a traveling wave parametric amplifying system embodying the principles of the invention; and FIG. 2 is a partial isometric drawing of another parametric amplifying structure employing principles of the invention.

Referring now more particularly to the drawing, FIG. 1 shows a schematic diagram of a parametric amplifier embodying principles of the invention. In this amplifier a first input transformer 12 is connected for receiving an energy wave from source 14 and for thereafter applying this wave to the input end of a first propagation path 16 which includes the outer two conductors of a transmission system having a substantially conventional three-conductor configuration. The source 14 is a power signal generator of a type well known in the art, for example a klystron tube, to generate an energy wave at a frequency designated $f_e$.

A second input transformer 22 is connected for supplying a signal wave from a source 24 to a center conductor 26 of the three-conductor transmission system for propagating these signal waves along a second path including both the outer conductors 16 and the center conductor 26. The signal wave source is a conventional source of low level signals to be amplified and may, for example, include an antenna receiving communications signal. Signal waves from this source are at a frequency $f_s$, though, as is well understood in the art, this specific frequency $f_s$ is a fundamental or center frequency, adopted for definiteness of discussion, but one which is associated with and includes a band of frequencies carrying intelligence information.

The first propagation path is terminated in an output transformer 32 having a primary winding connected across the two outer conductors of the transmission system and having a secondary winding associated with a dissipating resistor 34 of a suitable value, as is well known in the art, for matching the impedance of the first propagation path to prevent energy wave reflections.

The second propagation path includes an output transformer 42 having one winding connected in the center wire portion of the transmission system to a center tap on the output transformer 32 associated with the first propagation path. Thus, the energy wave and the signal wave are respectively applied to and propagated along the first and second propagation paths in an electrically balanced relation.

As shown in the drawing, the wave propagation paths comprise, by way of illustration, three like tandem connected stages bounded on either side by longitudinally spaced, opposed pairs of elements 44 which are non-linearly responsive to applied signals for intercoupling the two paths. The three stages shown in this illustrative embodiment advantageously may be repeated, with each successive stage yielding additional signal wave amplification. These intercoupling elements in this illustrative embodiment of the invention are each made up of two semiconductor diodes 46 and 48 which are connected in parallel between an outer conductor and the center conductor, but which are oppositely poled. These diodes are of the non-linear capacitive coupling type discussed by A. Uhlir, Jr., writing in the Proceedings of the Institute of Radio Engineers for June 1958 at page 1099 et seq., though they may be any of the many non-linearly responsive, signal controlled variable reactances known in the art.

Further associated with each of the propagation path stages are three inductors 52, 54, and 56 respectively connected in each of the three transmission system conductors, and a manually variable capacitor 58 connected across the two outer conductors.

In this schematic diagram, the variable capacitor and the inductors of each segment are shown as specific lumped reactance elements. In actuality, they are representative of all the impedances included in a transmission system in accordance with well-known analysis. Thus, the inductors and capacitors shown represent specific illustrative elements and, as well, include the distributed reactances and loss elements associated with the design of a transmission system. Following well-known theory, the representative inductors and capacitors shown are proportioned to yield particular transmission characteristics to the system of FIG. 1 as is discussed in more detail hereafter.

The signal wave from the source 24 is applied through the transformer 22 and is thereafter propagated along the center conductor 26 with each of the outer conductors 16 being a common return path; i.e., as the signal wave is propagated along the center conductor 26, an even symmetry exists for the electrical charges on the outer conductors 16 with respect to the center conductor 26. As the signal wave progresses along the transmission system through the three stages shown, it is delayed from stage to stage by a phase propagation constant $\beta_s$ which, in accordance with well-known design procedures, is established at a suitable value.

The energy wave from the source 14, at the same time, is applied through the transformer 12 between the outer conductors 16 and is propagated therealong. Thus, with respect to the center conductor 26, this energy wave is propagated with an odd symmetry along the two outer conductors. That is to say, in the upper conductor, as shown, a plus charge due to the energy wave finds a counterpart negative charge on the lower conductor. Accordingly, the energy wave and signal wave are propagated in electrically balanced relation.

Passing from the source 14 to the first stage of the transmission system, the energy wave acts to vary the capacitance of the non-linearly responsive, opposed pairs of intercoupling elements 44. By virtue of the two oppositely poled diodes comprising each of these intercoupling elements, as discussed heretofore, the resulting capacitance variations between the outer conductors and the center conductor is accomplished at a frequency which is double that of the energy wave itself.

The phase delay $\beta_e$ imposed upon the energy wave in passage through each of the tandem connected transmission stages, as shown, is established to a first order of approximation by well-known design criteria associated with the value of the inductors 52 and 56 and other circuit elements of the individual transmission system stages. Connected across the outer conductors in each of these stages is a variable capacitor 58. This capacitor is connected only between the outer conductors 16 and is isolated from the center conductor 26. Accordingly, adjustment of this capacitor 58 in each of the iterative sections affects only the velocity of propagation of the energy wave from the source 14.

As the energy wave is propagated along the outer conductors 16, the control action imposed upon the coupling diode elements 44 gives rise to an intercoupling wave or a pump wave of variable reactance at a frequency double that of the energy wave. With this intercoupling between the outer conductors and the center conductor, an intermodulation action takes place between the signal wave and the energy wave. This intermodulation action gives rise to a lower sideband wave, an idler wave, having a frequency $f_i$ and an upper sideband wave having a frequency $f_{us}$.

The propagation path comprising the center conductor 26 and the outer conductor 16 is constructed to impose phase delays $\beta_i$ and $\beta_{us}$ upon these waves, respectively, in their propagation across each of the transmission system stages. For accomplishing desirable energy interchanges these propagation constants $\beta$ are established to satisfy the relations of Expression C, i.e., $$\beta_s+\beta_i=\beta_p$$

Other propagation constants associated with other waves are similarly established within each of the illustrative three stages of the three-wire transmission system in accordance with other desirable mathematical relations to be discussed in detail hereafter. Establishment of the above-noted relationship, however, in this illustrative embodiment of the invention, leads to energy transfer from the energy wave to both the signal and idler waves.

In accordance with known mathematical analyses, these energy transfers increase exponentially as the signal and idler waves are propagated along the transmission system. This increased energy transfer is accompanied by a decrease in the propogation rate of the energy wave. This decrease tends to disestablish the desirable relationship for energy interchange noted above. The decrease may be considered to result from the non-linear change from stage to stage in the capacitance variation imposed by the decreasing amplitude of the energy wave in its action upon the intercoupling elements 44. Accordingly, adjustment of other parameters governing the propagation rate of the energy wave becomes necessary for maintenance of desired amplifying relationships. The variable capacitors 58 in each stage thus are suitable means for accomplishing this propagation rate adjustment as energy interchanging relationships tend to decay. By virtue of the balanced arrangements in accordance with the invention, these adjustments do not, at the same time, impose propagation rate variations upon the broad frequency band signal wave propagated in precise mathematical relation to the energy wave. Thus, balanced wave propagating structures provided in accordance with this illustrative embodiment of the invention enable independent adjustment of the wave propagation rates for both the energy wave and the signal wave. Hence, a desirable energy transfer from the former to the latter may be accomplished in as many tandem connected stages as desired, though in this illustrative embodiment of the invention only three such stages are shown.

Each of the successive three stages of the transmission system is further constructed to satisfy the conditions of Equations K and L; namely, $$\beta_p \neq \beta_{u_s} - \beta_s \quad (K)$$

and $$\beta_p \neq \beta_{u_s} - \beta_i \quad (L)$$

Hence, in accordance with Equation K, energy is not transferred from the energy wave to the upper sideband wave resulting from intermodulation action between the signal wave and the pump wave. Similarly, in accordance with Equation L, no energy is transferred to the upper sideband wave resulting from intermodulation action between the pump wave and the idler wave.

At the same time, taking note of Equation F, that is $$\beta_p^+ = 2\pi - \beta_p^- \quad (F)$$

each of the stages of the transmission system shown is further constructed to satisfy to a close approximation Expressions K*l* and L*l* which are the counterparts of Expressions K and L for waves propagated reversely. These equations are given below.

$$(2\pi - \beta_p) = \beta_{u_s} - \beta_s \quad (Kl)$$

and $$(2\pi - \beta_p) = \beta_{u_i} - \beta_i \quad (Ll)$$

Physically, satisfaction of these equations signifies that reversely propagated waves at the signal and idler frequency undergo a periodic energy interchange with the upper sideband waves associated with intermodulation action between these waves and the pump wave. That is to say, reversely propagated signal and idler waves which may result from reflective terminations of the amplifier in accordance with the invention undergo a periodic interchange of energy with waves in a much higher frequency region.

Each of the stages is further proportioned following Equation J such that this energy interchange passes through approximately one quarter of a full cycle. Advantageously, each section is designed to have an electrical length lying midway between the length determined by Equation J for the signal wave and its associated upper sideband wave on the one hand, and for the idler wave and its associated upper sideband wave on the other. Thus, the non-linear intercoupling elements of each stage are spaced apart in substantial proportion to the geometric means lying between signal and idler waves and respectively associated upper sideband waves.

Since the energy interchange established by satisfaction of Equation J involves full energy transfer to the upper sideband frequency regions in one quarter of a sinusoidally varying period, minor departures on either side of this quarter-cycle value do not involve significant lack of completeness in the desired energy transfer. This follows from the fact that sinusoidal functions have a zero rate of change at quarter-cycle points. Hence, virtually all the energy of reflected signal and idler waves is transposed to an upper frequency region.

For dissipation of this frequency transposed reflected energy, there is provided in accordance with the invention a high pass filter 25 designed in accordance with familiar techniques for passing frequencies substantially above the signal wave frequency. This filter is connected across the the signal wave source 24, and a dissipating resistor 27 is placed in serial connection with this high pass filter.

Thus, substantially all energy reflected at the signal wave and idler wave frequencies is transposed to a well-removed frequency region and dissipated in the resistor. Hence, the amplifying structure shown in FIG. 1 is freed of any regenerative action which might arise through the amplification of such reflected waves. Thus, this amplifying structure makes full use of the broadband parametric amplification enabled by the phase adjustment in the balanced propagation structures described.

Energy remaining in the energy wave after amplifying transposition to the signal and idler waves appears across the transformer 32, and the resistor 34 is coupled to the secondary winding of this transformer for dissipating this energy.

The amplified signal and idler waves, each carrying the informational content of the signal wave, appear across the transformer 42 quite separately from the energy wave, as shown. Thus, the balanced propagating structures of this embodiment of my invention eliminate the need for delicate and costly filters to separate this energy wave from the information carrying signal and idler waves. This feature of my invention is particularly important in considering that, in this embodiment of the invention having a pump wave exactly double the frequency of the energy wave, the frequency of that energy wave lies exactly midway between the frequency of the signal and idler waves. This close frequency positioning of the waves without practice of my invention would necessitate a delicately accurate band filter to avoid distorting the informational significance of these two information bearing waves.

Both these amplified information carrying waves, the signal wave and the idler wave, are applied to a substantially conventional mixer circuit 53 for transposition from the high frequency range at which parametric amplifiers are most effective for further amplification and utilization at lower frequencies in conventional circuit elements. To effect this transposition, the energy wave at half the pump wave frequency is applied from the source 14 through a phase shifter 55 in mixing relation to the mixer circuit 53. This energy wave at half the pump wave frequency lies exactly midway between the frequencies of the signal and idler waves. This follows from the fact that the latter information carrying wave is a product of intermodulation action between the signal wave and the pump wave having twice the energy wave frequency.

The phase shifting apparatus 55 corresponds to many such structures well known in the art and is employed to establish an optimum relation between the energy wave and the two waves with which this energy wave mixes in the mixer circuitry 53. As is well known in the art, and assuming the signal and idler waves to carry amplitude modulated information, for maximum efficiency this energy wave is applied to the mixer circuitry in a phase such that a maximum amplitude of the energy wave occurs at the instant in which maxima of the signal and idler waves occur. Were the signal and idler waves to be frequency modulated, the energy wave is applied in a phase quadrature relationship with this coincidence of maximums of signal and idler waves by the adjustment of the phase shifter 55.

With proper adjustment of the phase shifter 55, the information carrying energy contained in both the signal and idler waves is transposed to a single frequency range denoted in the drawing as $f_{out}$ and applied to a conventional amplifier 57 for further employment in a familiar utilization circuit 59, by way of example, an audio amplifier. Thus, in accordance with the invention, in this important aspect the balanced propagating structures provided permit employment of the energy source as a local detection oscillator to avoid expensive high frequency signal generators. At the same time, the information bearing power derived from the parametric amplifier in accordance with the invention is substantially quadrupled over prior art parametric amplifiers which effectively utilize the information power of only one wave from the signal and idler waves.

Referring now to FIG. 2, there is seen an illustrative embodiment of the invention in which advantageous use is made of the principles of the invention to provide a simplified, conveniently portable, and structurally unitary amplifying structure.

In this FIG. 2, a coaxial structure employing a longitudinally extending central conductor member 66 and, coaxial therewith, a tubular external conductive shield member 76. The central conductor 66 includes an upper and lower conductive element 67 and 69 spaced apart by a dielectric member 68. In this embodiment of FIG. 2, elements corresponding to those of the embodiment of FIG. 1 are similarly numbered and have similar functions. An energy wave is supplied from a source between the two conductive elements 67 and 69 of the central conductor 66. Four pairs of opposed intercoupling elements 44 are spaced along the central conductor for defining three stages in the transmission path shown.

Each of these coupling elements 44 comprises a pair of parallel connected, oppositely poled, non-linearly variable reactance devices such as the semiconductor diodes of Uhlir cited hereabove. These intercoupling elements respectively interconnect the longitudinally extending external conductor 76 with the two conductive members 67 and 69 associated with the central conductor 66. In each of the three stages of the coaxial structure, an adjustable capacitor 58 is provided for interconnecting the two longitudinally extending central conductive members 67 and 69.

An output transformer 32 is connected across the two central conductive elements 67 and 69 to receive energy transmitted through the coaxial structure from the source 14. A resistor 34 is connected across the secondary winding of that transformer 32 for dissipation of residual energy from this source. A signal wave source 24 applies a wave to be amplified between the outer conductor 76 and the central conductor 66 through a center tap connection to an input transformer 72 associated with the energy wave source 14. A high pass filter 25 and a dissipating resistor 27 of the same type and for the same purpose as those discussed in connection with the embodiment of FIG. 1, are connected across the signal wave source for dissipating reflected signal and idler wave energy.

The signal wave is amplified in propagation along the coaxial structure of FIG. 2 by the intercoupling of energy from the source 14 through the intercoupling elements 44. Thus, signal and idler waves are propagated at growing amplitudes in a well-known coaxial mode between the outer conductor 76 and the central conductor 66. Arriving at the output transformer 32, the idler wave and signal wave are separated at a center tap in the primary winding of the output transformer 32 from any residual energy propagated from the energy wave source 14.

Signal and idler waves are applied to a mixer circuit 53 for mixing with a wave derived from the source 14 and applied in optimum phase through a phase shifter 55. Thus, half the energy in both the signal and idler waves is combined in a single signal of reduced frequency $f_{out}$. This combined signal is further applied to amplifier 57 for employment in a utilization circuit 59. Thus, in this structural embodiment of the invention, the principles of the invention are turned to account in a unitary coaxial structure providing balanced propagation paths for the energy supplying wave and the signal wave as discussed in detail above.

While specific illustrative embodiments of this invention have been described herein, it is, of course, to be understood that the above-described arrangements are merely illustrative of the application of the principles of the invention. Thus, numerous other arrangements may be devised by those skilled in the art without departing from the spirit and scope of the invention.

What is claimed is:

1. Traveling wave apparatus for amplifying a signal wave comprising first, second, and third conducting members forming first and second wave propagation paths, means for applying a signal wave to be amplified to said first path with even symmetry relative to one of said conducting members and means for applying an energy wave to said second path with odd symmetry relative to said one of said conducting members, whereby said waves propagate along said paths in balanced relationship, and a plurality of means spaced along said paths for non-linearly intercoupling the waves propagating on said paths at spaced points therealong.

2. Traveling wave apparatus as claimed in claim 1 further including means spaced along one of said wave propagation paths for adjusting the velocity of propagation of one of said waves independently of the velocity of propagation of the other of said waves.

3. Traveling wave apparatus as set forth in claim 1, wherein said wave propagation paths comprise a longitudinally extending hollow conductive member and a pair of longitudinally extending spaced apart conductive members centrally disposed within said hollow member.

4. A traveling wave parametric amplifier comprising first and second means for defining a first wave propagation path, third means for defining with said first and second means a second wave propagation path, means for applying an energy wave across said first and second means, means connected to said energy wave applying means and in series with said third means for applying a signal wave to said third means, high-pass filter means connected across said means for applying said signal wave to said third means, dissipative means connected to said filter means for absorbing reflected energy, a plurality of means for non-linearly intercoupling an energy wave on said first propagation path and a signal wave on said second propagation path, means across said first and second means for terminating said first propagation path, and means in series with said third means for removing the amplified signal wave from said second wave propagation path.

5. A traveling wave parametric amplifier as claimed in claim 4 further comprising a mixer circuit connected to said means for removing said amplified signal wave from said second wave propagation path, a phase shifter connected to said mixer circuit, means for applying said energy wave to said phase shifter, and output means connected to said mixer circuit.

6. A traveling wave parametric amplifier comprising first and second means for defining a first wave propagation path, third means for defining a second wave propagation path, means for applying an energy wave across said first and second means, means connected to said energy wave applying means and in series with said third means for applying a signal wave of frequency $\varpi_s$ to said third means, a plurality of means for non-linearly intercoupling waves on said first and second propagation paths, whereby a pump intercoupling wave of frequency $\varpi_p$ is produced and an idler wave of frequency $\varpi_i$ is produced on said second propagation path, the relationship of the frequencies of the pump, signal and idler waves being given by the expression $\varpi_s+\varpi_i=\varpi_p$, and means in series with said third means for removing amplified signal and idler waves from said second wave propagation path.

7. Traveling wave apparatus for amplifying a signal wave comprising a first propagation path for propagating an energy wave with a phase propagation constant $\beta_e$, a second propagation path for propagating said signal wave in at least a forward direction with a phase propagation constant $\beta_s$, a plurality of means spaced along said propagation paths for non-linearly intercoupling wave energy propagating in said paths, first means for applying said energy wave to said first path for establishing an intercoupling pump wave along said first path, said first path having for said pump wave a phase propagation constant $\beta_p$ proportioned directly to $\beta_e$, second means for applying said signal wave to said second path, said second path comprising means for freely propagating in at least said forward direction at least one of two sideband wave products of intermodulation action between said pump wave and said signal wave, the lower and upper ones of said sideband wave products being propagated with phase propagation constants $\beta_i$ and $\beta_{u_s}$ respectively, said first and second named applying means and said first and second named propagation paths being connected for applying and propagating said energy wave and said signal wave in electrically balanced relation, and means interspaced along at least one of said paths for adjusting the velocity of waves propagated therein to satisfy at least one of the two relations $$\beta_p+\beta_s=\beta_{us} \quad (1)$$

and $$\beta_s+\beta_i=\beta_p \quad (2)$$

whereby there is a transfer of energy between said energy wave and said signal wave, and means for deriving an amplified output signal corresponding to said signal wave.

8. Apparatus as set forth in claim 7 wherein each one of said plurality of intercoupling means comprises a parallel arrangement of two asymmetrically conducting devices connected between said first and second paths, said devices being oppositely poled relative to each other.

9. Apparatus as set forth in claim 8 wherein at least two of said intercoupling means are spaced apart a distance $l$ along said paths substantially in accordance with the relation $$l=2n\pi k\ (\omega_1\omega_2)^{-1/2}$$

where $\omega_1$ is proportioned to the frequency of a wave selected from among said signal wave and said lower sideband wave, and $\omega_2$ is proportioned to the upper sideband wave associated with said selected wave, $n$ is an odd integer and $k$ is a constant.

10. Apparatus as set forth in claim 7 and in combination therewith detection circuitry including frequency mixing means for receiving said signal wave and said lower sideband wave after propagation along said second path, and means for applying a mixing signal to said mixing means at a frequency lying midway between the frequency of said signal wave and said lower sideband wave.

11. Apparatus as set forth in claim 10 wherein said means for applying said mixing signal to said mixing means comprises phase adjusting means for adjusting the phase of said energy wave in relation to the phases of said signal wave and said lower sideband wave.

12. Traveling wave apparatus for amplifying a signal wave propagated in a forward direction comprising a source of an energy wave, a first propagation path for propagating an energy wave from said source with a phase propagation constant $\beta_e$, a second propagation path for propagating said signal wave with a phase propagation constant $\beta_s$, a plurality of means spaced along said paths for non-linearly intercoupling said waves in said paths, first means for applying said enregy wave to said first path for actuating said intercoupling means to establish an intercoupling pump wave, said first path having for said pump wave a phase propagation constant $\beta_p$ proportioned to $\beta_e$, second means for applying said signal wave to said second path, said second path comprising means for propagating a lower sideband wave resulting from intermodulation action between said pump wave and said signal wave, with a phase propagation constant $\beta_i$, said first and second applying means comprising means for applying said energy wave and said signal wave in balanced relation to said paths, plural means spaced along one of said paths for adjusting the propagation of said waves along said paths in substantial accordance with the relation $$\beta_s+\beta_i=\beta_p$$

whereby energy from said energy wave is transferred to said signal wave, said second path being further constructed for propagating an upper sideband wave resulting from intermodulation action between said pump wave and said signal wave with a phase propagation constant $\beta_{us}$ related to said other propagation constants in substantial accordance with the relation $$\beta_s+(2\pi-\beta_p)=\beta_{us}$$

whereby there is an interchange of energy between said upper sideband wave and a signal wave reversely propagated along said second path, and frequency selective means for dissipating energy in said upper sideband frequency range, said frequency selective means being connected for receiving waves propagated in said second path.

13. Apparatus as set forth in claim 12 wherein at least two of said plurality of intercoupling means are spaced apart along said paths in proportion to the geometric mean of the frequency of said signal wave and the frequency of said upper sideband wave.

14. Traveling wave apparatus for amplifying a signal wave propagated in a forward direction comprising a source of an energy wave, a first propagation path for propagating an energy wave from said source with a phase propagation constant $\beta_e$, a second propagation path for propagating said signal wave with a phase propagation constant $\beta_s$, a plurality of means spaced along said paths for nonlinearly intercoupling said waves in said paths, first means for applying said energy wave to said first path for actuating said intercoupling means to establish an intercoupling pump wave, said pump wave having associated therewith a phase propagation constant $\beta_p$ proportioned to $\beta_e$, second means for applying said signal wave to said second path, said second path being constructed for propagating a lower sideband wave and a first upper sideband wave resulting from intermodulation action between said signal wave and said pump wave, with phase propagation constants $\beta_i$ and $\beta_{us}$, and for further propagating a second upper sideband wave, resulting from intermodulation action between said lower sideband wave with said pump wave with a phase propagation constant $\beta_{ui}$, said first and second applying means comprising means for applying and propagating said energy wave and said signal wave in balanced relation, plural means spaced along said paths for adjusting the propagation of said waves along said paths in substantial accordance with the relation $$\beta_s+\beta_i=\beta_p$$

whereby there is a transfer of energy from said energy wave to said signal wave and to said lower sideband wave, said second path further comprising means for substantially satisfying the relations $$\beta_s+(2\pi-\beta_p)=\beta_{us}$$
$$\beta_i+(2\pi-\beta_p)=\beta_{ui}$$

whereby there is a periodic interchange of energy between a signal wave reversely propagated along said second path and said first upper sideband wave and between a lower sideband wave reversely propagated along said path and said second upper sideband wave, and frequency selective means connected in said second path for dissipating wave energy in a frequency range above the frequency of said pump wave.

15. Apparatus as set forth in claim 14 wherein at least two of said plurality of means are spaced apart along said paths in substantially proportionate relation to the two geometric means respectively lying between the frequency of said signal wave and the frequency of said first upper sideband wave and between the frequency of said lower sideband wave and the frequency of said second upper sideband wave for transferring substantially all energy reversely propagated at the frequencies of said signal and lower sideband waves to said first and second upper sideband waves.

16. A traveling wave parametric amplifier comprising a three conductor transmission system, means comprising a transformer having a secondary winding for applying an energy wave across two of said conductors, each of said two conductors being connected to one end of said secondary winding whereby said two conductors define a first propagation path, means for applying a signal wave in series with the third of said conductors, said third conductor being connected to the mid-point of said secondary winding whereby said third conductor defines a second propagation path, a plurality of means for non-linearly coupling each of said two conductors to said third conductor to attain parametric intercoupling between said waves on said first and second propagation paths, dispersive means across said two conductors for terminating said first propagation path, and means in series with said third conductor for removing the amplified signal wave from said second propagation path.

17. A traveling wave parametric amplifier comprising a three conductor transmission system, means for applying an energy wave across two of said conductors whereby said two conductors define a first propagation path, means for applying a signal wave in series with the third of said conductors whereby said third conductor defines a second propagation path, means interconnecting said two conductors at intervals thereon for adjusting the velocity of propagation of said first propagation path independently of the other path, a plurality of means for non-linearly coupling each of said two conductors to said third conductor to attain parametric intercoupling between said waves on said first and second propagation paths, dispersive means across said two conductors for terminating said first propagation path, and means in series with said third conductor for removing the amplified signal wave from said second propagation path.

References Cited in the file of this patent

Tien et al.: "A Traveling-Wave Ferromagnetic Amplifier," IRE Proceedings, April 1958, pp. 700–706.

Tien: "Journal of Applied Physics," September 1958, pages 1347–1357.